United States Patent [19]

Lombardi

[11] Patent Number: 5,378,979
[45] Date of Patent: Jan. 3, 1995

[54] METHOD AND APPARATUS FOR EFFICIENTLY COMPUTING SYMMETRIC SEQUENCE SIGNALS IN A THREE PHASE POWER SYSTEM

[75] Inventor: Steven A. Lombardi, Waukesha County, Wis.

[73] Assignee: Allen-Bradley Company, Inc., Milwaukee, Wis.

[21] Appl. No.: 981,573

[22] Filed: Nov. 25, 1992

[51] Int. Cl.⁶ .............................. G01R 1/04
[52] U.S. Cl. ..................... 324/107; 324/86; 324/509
[58] Field of Search .................. 324/86, 509, 110, 127, 324/126, 117 R, 76.11

[56] References Cited

U.S. PATENT DOCUMENTS 5,055,769 10/1991 Gentile ................................ 324/86

*Primary Examiner*—Louis Arana
*Assistant Examiner*—Barry C. Bowser
*Attorney, Agent, or Firm*—Mark W. Pfeiffer; Keith M. Baxter; H. Frederick Hamann

[57] ABSTRACT

A real time three-phase analyzer stores digitized values of the signals of the three-phase circuits in memory so that they may be addressed according to circuit and sample number. Positive, negative and zero phase sequences are developed without the need for trigonometric calculation by combining samples offset in memory by a number of samples approximating 120°. That number of samples may be determined for an arbitrary frequency of the three-phase system by identifying zero-crossing points of one such signal and assuming the number of samples equates to 360° of phase of that circuit. The phase sequence of the three circuits necessary for the calculation of the positive, negative and zero phase sequences may be determined by comparing the relative position of positive going zero-crossings for each of the three circuits.

11 Claims, 5 Drawing Sheets

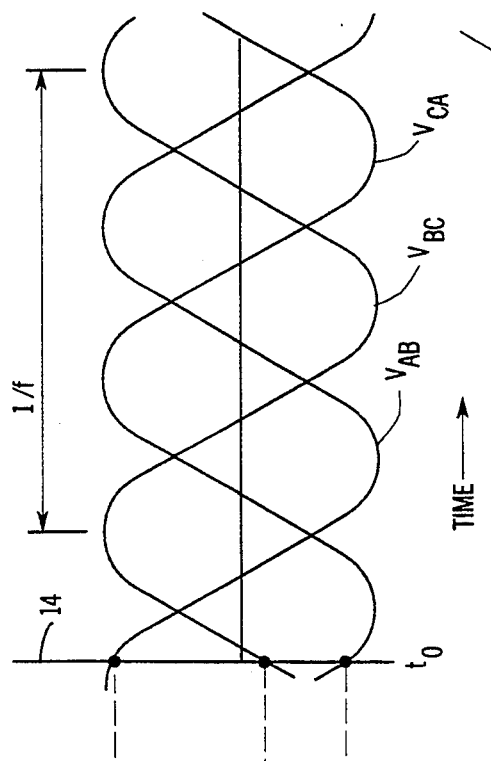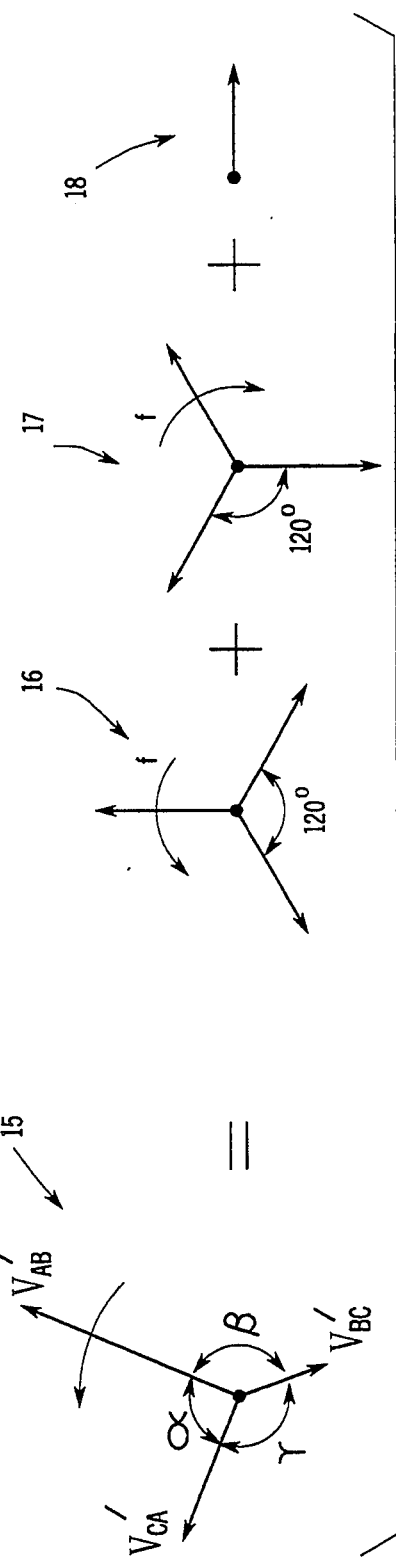
FIG. 1
FIG. 2

METHOD AND APPARATUS FOR EFFICIENTLY COMPUTING SYMMETRIC SEQUENCE SIGNALS IN A THREE PHASE POWER SYSTEM

FIELD OF THE INVENTION

The invention relates generally to instruments for measuring three-phase power and specifically to an instrument for providing real-time symmetrical component analysis of three-phase power systems to evaluate whether a three-phase system is balanced.

BACKGROUND OF THE INVENTION

Residential wiring is typically single phase alternating current and employs two active conductors across which a sinusoidal voltage is developed. In contrast, industrial wiring is more commonly for three-phase alternating current and employs three active conductors, each pair of which presents one of three different sinusoidal voltages. Each of these three voltages differs in phase from the others by approximately 120°.

The advantages of three-phase power over single phase power are well recognized and include improved generator and motor efficiency, e.g., three-phase power produces less "iron loss" in rotating machinery, and improved power transmission, i.e., with balanced loads the transmission of power in a three-phase system is constant.

Three-phase power is produced by the proper positioning of three windings in an alternator. When one side of each winding is connected at a single point, the windings are said to be connected in the "star" or "Y" configurations. When the windings are connected in ring fashion, with the ends of each winding connected to its neighbors, the windings are said to be connected in the "Δ" configuration. Although the following discussion will refer to a Y connected system, the present invention works with both Y and Δ three-phase systems.

Referring now to FIG. 1, a three-phase alternator 10 has three windings connected in a Y configuration, a first end of the windings sharing a common connection O and the second end of the windings connected to exposed terminals A, B and C. Each of the terminals is connected to a conductor 11 for transmitting the generated three-phase power.

Power is obtained from the alternator 10 across pairs of the terminals A, B and C, each pairwise connection being termed a circuit. The, voltage of each circuit is identified by its terminals as: $V_{AB}$, $V_{BC}$ and $V_{CA}$ respectively, where, for example, $V_{AB}$ is the voltage at any given time across terminals A and B of the alternator 10.

A phasor diagram 12 of the voltages generated by the alternator 10 consists of three phasors $V_{AB}$, $V_{BC}$ and $V_{CA}$ spaced equally at 120° from each other about an origin 13. Each phasor has a constant magnitude $v_{AB}$, $v_{BC}$ and $v_{CA}$ is considered to rotate about the origin 13 at a line frequency f in a phase sequence. The projection of these phasors on an axis 14 traces the voltages wave forms $V_{AB}$, $V_{BC}$ and $V_{CA}$ with time.

It will be recognized that another similar phasor diagram may be constructed indicating currents flowing between the terminals A, B and C with phasors (not shown) $I_A$, $I_B$ or $I_C$ having magnitudes $i_A$, $i_B$ or $i_C$, respectively. The currents and voltages produced by each circuit of the alternator 10 are referred to generally as "electrical signals".

A three-phase system is "in balance" when the magnitude and angular spacing of the phasors (voltage or current) of each circuit are equal. A balanced system will produce three equal peak amplitude electrical signals, one associated with each circuit, that differ in phase by 120° A balanced three-phase system provides the highest electrical efficiency: three-phase motors, for example, operating on unbalanced three-phase power will experience increased rotor heating which represents a loss of power. Unbalance in a three-phase system may indicate an improper wiring of loads across only one phase or may foreshadow equipment failure, for example: a faulty winding in a motor or alternator or a ground fault condition. For these reasons, determining the state of balance or unbalance of a three-phase system is important.

Balance or lack thereof in a three-phase system may be described by simply listing the phasor magnitudes and angles of the power on the three circuits. This description is not very illuminating however, and therefore it is preferable to describe the balance of a three-phase system through a symmetric component analysis. Such an analysis decomposes the unbalanced system's unsymmetrical phasor diagram into three symmetric phasor components: a positive phase sequence, a negative phase sequence and a zero phase sequence.

Referring to FIG. 2, a phasor diagram of an unbalanced three-phase system 15 may be represented by phasors $V'_{AB}$, $V'_{BC}$ and $V'_{CA}$ of different magnitudes spaced apart at different angles α, β and γ. As mentioned, the degree of unbalance in such a system is clarified by decomposing the unbalanced system 15 into its symmetric components of: a positive sequence voltage 16, a negative sequence voltage 17 and a zero sequence voltage 18.

The positive sequence voltage 16 is represented by a set of three equally spaced phasors of equal magnitude rotating with frequency f equal to that of the unbalanced system 15. The positive sequence voltage is the balanced part of the unbalanced system which supplies the positive torque to motors and the like connected to the system.

The negative sequence voltage 17 is also a set of three equally spaced phasors of equal magnitude, but rotating in the opposite direction of the positive sequence voltage phasors with a frequency f. The negative sequence voltage represents a counter-rotational torque on motors or power loss caused by unbalance in the unbalanced system 15.

The zero sequence voltage 18 is a non-rotating phasor. The zero sequence voltage 18 represents an unbalanced system 15 such as might be associated with a ground fault in a Δ system or a neutral current in a Y system.

The vector addition of the phasors of the positive sequence voltage 16, the negative sequence voltage 17 and the zero sequence voltage 18 produce the phasors of the unbalanced system 15. The magnitude of the phasors of the positive, negative and zero sequence voltages for a given unbalanced system 15 having phasors $V'_{AB}$, $V'_{BC}$ and $V'_{CA}$ are calculated as follows:

$$\text{Pos. Seq. Volt.} = \frac{(V'_{AB})*(1\angle 0°) + (V'_{BC})*(1\angle 120°) + (V'_{CA})*(1\angle 240°)}{3} \quad (1)$$

$$\text{Neg. Seq. Volt.} = \quad (2)$$

-continued $$\text{Zero Seq. Volt.} = \frac{(V_{AB})*(1\angle 0°) + (V_{BC})*(1\angle 240°) + (V_{CA})*(1\angle 120°)}{3} \quad (3)$$

$$\frac{(V_{AB})*(1\angle 0°) + (V_{BC})*(1\angle 0°) + (V_{CA})*(1\angle 0°)}{3}$$

where, for example, $(1\angle 0°)$ designates a unit length vector at a phase angle of 0° with respect to some fixed reference generally perpendicular to the projection axis 14, and the '*' operator is the scalar or dot product such that:

$$V_1 * V_2 = v_1 v_2 \cos\theta \quad (4)$$

where $\theta$ is the included angle between the vectors or phasors. The results of equations (1) to (3) are scalar functions of time. The magnitude of the phasors for each of the symmetrical components 16, 17, and 18 is the peak value of this scalar function during one cycle.

The magnitude of current vectors for the positive sequence current, the negative sequence current, and the zero sequence current may be, likewise, calculated as follows:

$$\text{Pos. Seq. Cur.} = \frac{(I_A)*(1\angle 0°) + (I_B)*(1\angle 120°) + (I_C)*(1\angle 240°)}{3} \quad (5)$$

$$\text{Neg. Seq. Cur.} = \frac{(I_A)*(1\angle 0°) + (I_B)*(1\angle 240°) + (I_C)*(1\angle 120°)}{3} \quad (6)$$

$$\text{Zero Seq. Cur.} = \frac{(I_A)*(1\angle 0°) + (I_B)*(1\angle 0°) + (I_C)*(1\angle 0°)}{3} \quad (7)$$

The similarity of the calculations for the sequence voltages given by equations (1)–(3) and the sequence currents given by equations (5)–(7) will be employed to simplify the following discussion in which "positive sequence", for example, refers to either positive sequence current or positive sequence voltage. The sequences of equations (1)–(3) and (5)–(7) will be referred to generally as "symmetric sequences".

Despite the usefulness of symmetric component analyses of unbalanced three-phase systems, the determination of the voltages associated with each component phasor requires complex vector mathematics. Such mathematical analysis may be readily performed on a digital computer, however, the cost of computer hardware capable of performing these calculation in real-time, or near real-time as is ordinarily desired, is prohibitive for many applications in which such information is desired.

For this reason, it is known to perform the vector mathematics needed for symmetrical component analyses with "analog" circuitry in which the vector multiplications are approximated by combinations of phase inversions and phase shifting networks of capacitors and inductors and the scalar additions are accomplished with a summing junction. Such analog systems are capable of near real-time calculation of the symmetrical components of a three-phase system but are extremely frequency sensitive and will provide erroneous decompositions if the frequency of the three-phase power shifts significantly from the frequency at which the networks were calibrated.

SUMMARY OF THE INVENTION

The present invention provides a simple and potentially low cost instrument for analyzing three-phase power as it may be decomposed into symmetrical sequences to reveal unbalance. The inventing may operate in real time.

Specifically, the instrument employs a data acquisition system receiving the electrical signals for each circuit of the three-phase system. The data acquisition system produces digitized samples of the electrical signals at sample intervals and stores these digitized samples in a computer memory so that the sample number and circuit of the sample are preserved. A memory access device reads samples from the memory for each of the circuits and sums them to create symmetric sequence signals, such as the positive voltage signal. The samples that are summed are offset from each other in sample number so that the phase of the electrical signal of each samples differs from the phase of the electrical signals of the other samples read by substantially 120°.

It is thus one object of the invention to avoid the need for complex trigonometric calculations or imprecise analog networks in the computation of symmetric sequences. By storing the signals from each of the three circuits of the three-phase system, the effective vector multiplication may be realized by the calculation of an offset in sample number and the accessing of samples taken at different times. If the sampled data is stored in sequence in computer memory, the sample number offset corresponds simply to an address offset which may be rapidly calculated with current, low cost microprocessors.

It is another object of the invention to provide both negative, positive and zero phase sequence values without the need for additional hardware. An analog circuit for providing each of these symmetric sequences would require additional circuitry for each sequence. In the present invention, the same stored sample values of the three-phase signals may be used to obtain the negative and positive and zero phase sequence of the three-phase system merely by adjusting the address offsets.

The instrument may include a zero-crossing detector for locating a first, second, and third sample in the computer memory for the first, second and third circuits of the three-phase system at which the signals of those circuits first change from negative to positive. These samples may be received by a phase sequence identifier to identify the signal of the second circuit as the second signal of the phase sequence only if the sample number of the second sample is less than the sample number of the third sample and otherwise to identify the signal of the third circuit as the second signal of the phase sequence.

It is, therefore, yet another object of the invention to provide an instrument, for evaluating unbalanced systems, that may be connected to circuits of the three-phase system without regard to the phase sequence of the signals on the particular conductors. The determination of phase sequence for the purpose of calculating of the symmetric sequences may be made automatically.

The instrument may also include a zero-crossing detector which locates a first and second sample in the computer memory for one circuit at which the values of the samples have first changed from negative to positive. A ratio engine evaluates the time separating the first and second sample and establishes a corresponding time between samples separated by 120° of signal phase. This corresponding time is used by the memory access device to selected the proper samples for calculating the symmetric sequences.

It is thus another object of the invention to provide a system for measuring unbalance in a three-phase electrical system that is robust against changes in frequency. Detecting the zero-crossings of the electrical signals allows the sample time to be accurately related to the phase angle of the waveform. After this relationship has been determined, the offset in sample address may be adjusted to accommodate three-phase systems of varying frequency.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, reference must be made therefore to the claims herein for interpreting the scope of the invention.

BRIEF DESCRIPTION OF THE DRAWINGS

FIG. 1 is a schematic representation of the windings of a three-phase alternator and the corresponding voltages produced by that alternator as represented by a phasor diagram and associated graph of voltage amplitude versus time as described above in the Background of the Invention;

FIG. 2 is a pictorial representation of the decomposition of a phasor diagram of an unbalanced three-phase system into a positive sequence, a negative sequence and a zero sequence as also represented by phasor diagrams and as also described above in the Background of the Invention;

DETAILED DESCRIPTION OF THE PREFERRED EMBODIMENT

Figure 3:
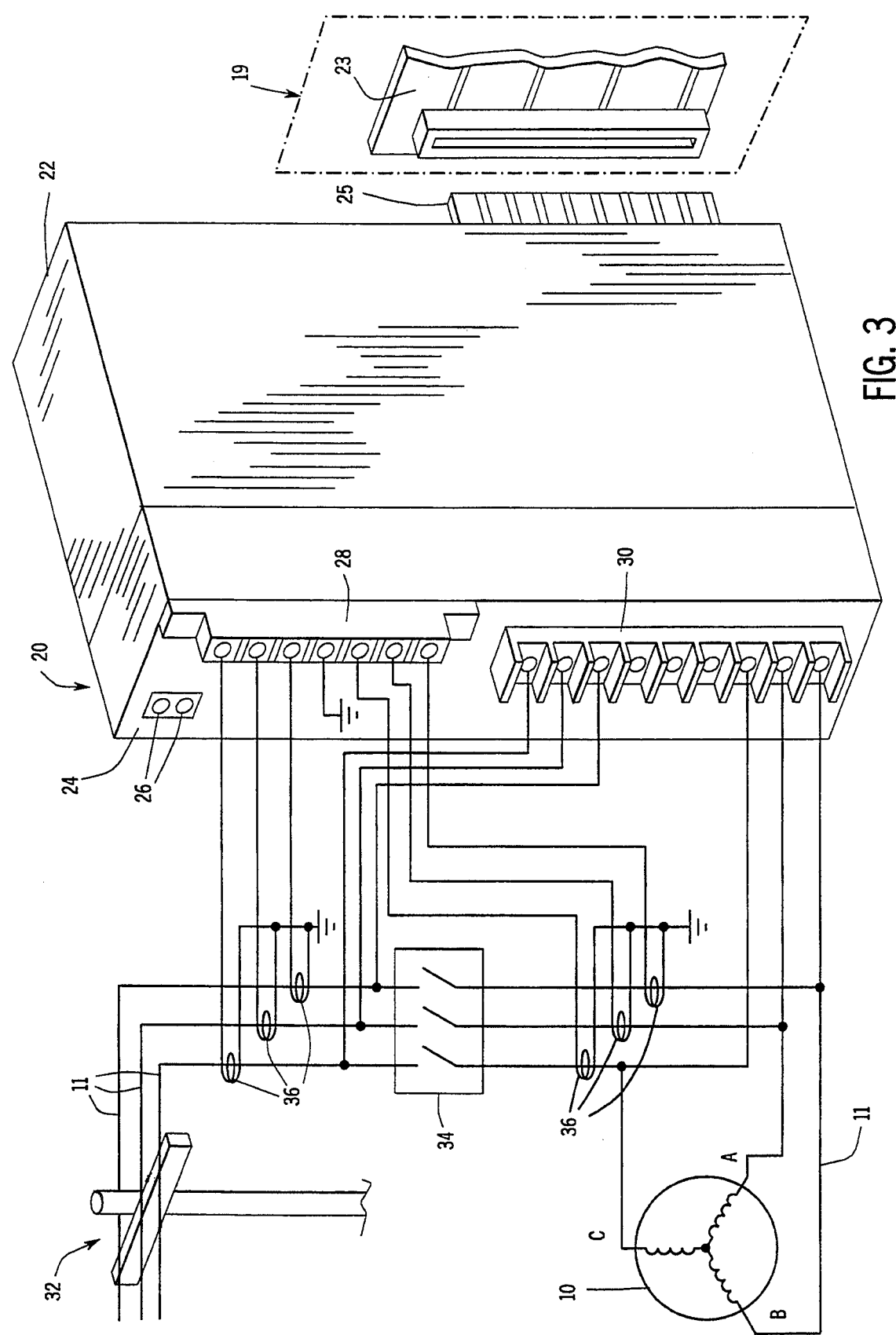
FIG. 3 is an wiring diagram of the connection of the instrument of the present invention, as incorporated into a module of an programmable controller, to two sources of three-phase power.

Referring to FIG. 3, the three-phase monitor 20 of the present invention is incorporated in a module 22 for use in a programmable controller, represented by broken lines 19. Programmable controllers 19, such as are understood to those of ordinary skill in the art, are specialized computers for use in an industrial environment and are described in U.S. Pat. Nos. 3,810,118; 3,942,158; 4,165,534; and 4,442,504, each assigned to the assignee of the present invention and incorporated by reference.

The monitor 20 communicates with a backplane 23 of the programmable controller 19 through a connector 25 so to obtain operating power and to communicate with other modules that may be included in the programmable controller 19 such as a processor module (not shown) and interconnected input and output (I/O) modules (not shown).

A front panel 24 of the monitor 20 contains status indicating lamps 26, which indicate the proper operation of the circuitry of the monitor 20, and connectors 28 and 30 which allow connection of the monitor 20 to sources of three-phase power as will be described. Connector 30 is a removable connector block such as is taught in U.S. Pat. No. 4,151,583 hereby incorporated by reference. Connector 28 is a screw type connector intended to prevent inadvertent disconnection of the leads attached to it, as will described further below.

During operation, the monitor 20 is connected to both a three-phase power bus 32, generally being a portion of the power grid from a central supplier, and to a local alternator 10. The speed of the local alternator 10 is typically under the control of the programmable controller 19 which transmits control signals from other I/O modules to alternator control circuitry (not shown).

Three conductors of the bus 32 and a corresponding three conductors of the alternator 10 are joined through a switch 34 so that alternator 10 may supplement the power from bus 32. Closure of the switch 34 requires that the three-phase systems of the bus 32 and alternator 10 be perfectly synchronized, and substantially balanced, otherwise the connection of switch 34 will create potentially damaging high current flow between the alternator 10 and the bus 32.

The monitor 20 receives voltage information from each of the conductors of the bus 32 and the alternator 10 via connections to connector 30. Electrical current information is received by the monitor 20 from the bus 32 and the alternator 10 through current transformers 36 inductively coupled to the conductors 11 of the bus 32 and the alternator 10. Leads from these current transformers 36 are connected to connector 28 which, as noted, is constructed to prevent inadvertent disconnection of the secondary of the current transformers 36 from the connector 28 and the monitor 20 while there is current flowing in the primary the current transformers 36. Such disconnections risk the generation of "flashover" or arcing at the secondary of the current transformers 36.

Through the connections to connector 28 and 30, the monitor 20 may monitor the voltages of and the current flowing in each of the circuits of the three-phase system of the bus 32 and the alternator 10.

Figure 4:
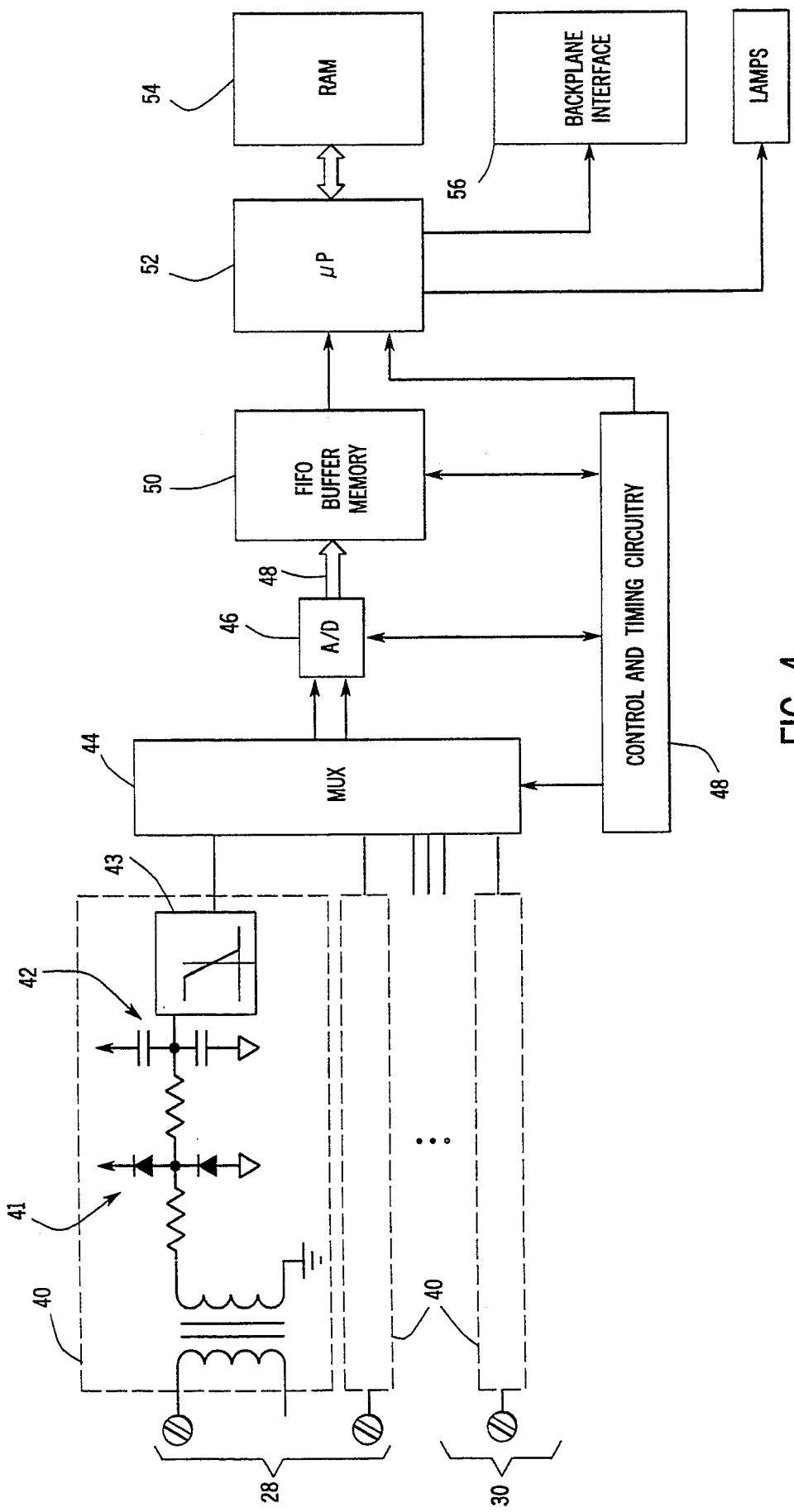
FIG. 4 is a schematic block diagram of the instrument of FIG. 3 incorporating a data acquisition system for sampling the circuits of a three-phase system employing a microcontroller and an associated random access memory receiving those samples.

Referring now to FIG. 4, each of the current and voltage inputs, from the bus 32 and alternator 10 to connectors 28 and 30, are received by input circuits 40 which provide over-voltage and current protection to the circuitry of the monitor 20 through diode and capacitor networks 41 and 42. Input circuits 40 also include filters 43 to remove high frequency harmonics and noise from the electrical signals of each circuit which might affect the subsequent zero-crossing phase measurements as will be described. In a preferred embodiment, the filters 43 are switched capacitor 5th order Butterworth low pass filters with a cutoff frequency of 96 Hz.

The outputs of each input circuit 40 are received by one input of a multiplexor 44 which sequentially connects each of the twelve current and voltage inputs from the three circuits of the bus 32 and alternator 10 to inputs of an analog to digital converter ("A/D convertor") 46 under the control of control and timing circuitry 48. The combined action of the multiplexor 44 and the A/D convertor 46 "samples" the electrical signals of the three-phase circuits to produce digitized sample values which are stored in a first in first out ("FIFO") buffer memory 50.

Each of the multiplexor 44, the A/D convertor 46, and the FIFO memory are coordinated by the control and timing circuitry 48 to store a sufficient number of samples to accurately record a full cycle of the first electrical signal in the phase sequence of each three-phase source ("the first phase") and a full cycle, after the first positive-going zero-crossing of the first phase, of the electrical signals that comprise the second and third phases of the phase sequence.

In the preferred embodiment, 64 samples are taken for each cycle of the three-phase systems of each of the twelve circuits connected to the monitor 20. FIFO buffer memory 50 is sized to exceed this requirement and has four kilobytes of memory.

The control and timing circuitry 48 obtains the required complete cycles of the twelve signals representing three circuits of the two sources of the bus 32 and the alternator 10 measured by voltage and current and then stops collection of samples and signals a microcontroller 52 that data has been acquired. Microcontroller 52 reads the FIFO buffer memory 50 into its connected random access memory ("RAM") 54 for determination of the desired symmetric components as will be described. The results of this decomposition may be communicated to the programmable controller 19 via backplane 23 (of FIG. 3) via backplane interface 56 described in U.S. Pat. No. 5,065,314 hereby incorporated by reference. The data from the symmetric component analysis may be employed by the programmable controller 19 for control purposes or logged or displayed via a terminal connected to the programmable controller 19. Terminals suitable for this purpose are described in U.S. Pat. No. 4,527,450 incorporated herein by reference. The microcontroller 52 also controls the illumination of lamps 26. Microcontroller 52 is a general purpose microcontroller such as manufactured by Intel Corporation of Santa Clara, Calif.

Figure 6:
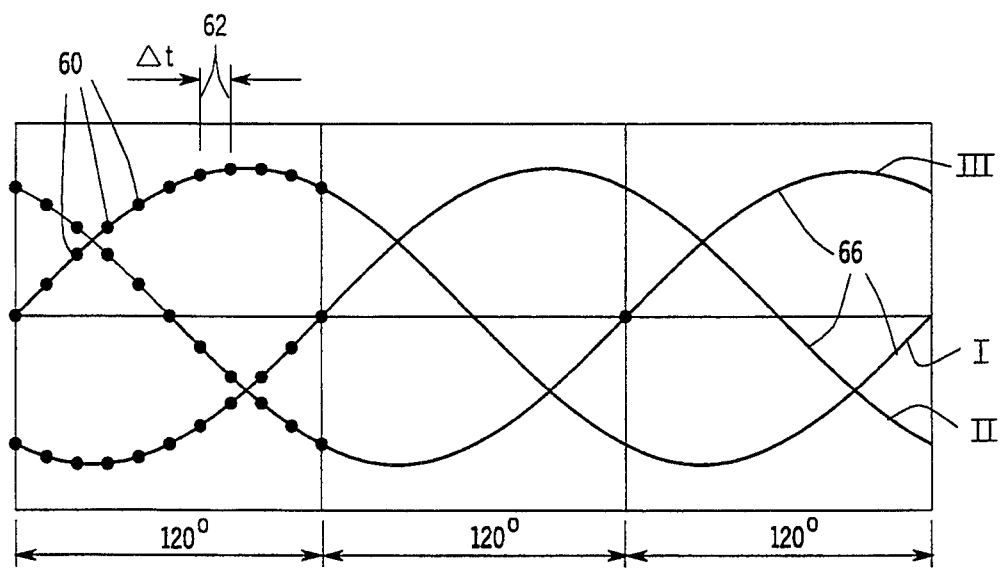
FIG. 6 is a plot of voltage versus time for a hypothetical three-phase system as monitored by the instrument of FIGS. 3 and 4 showing the sample intervals at which data is sampled by the data acquisition of FIG. 4.
Figure 7:
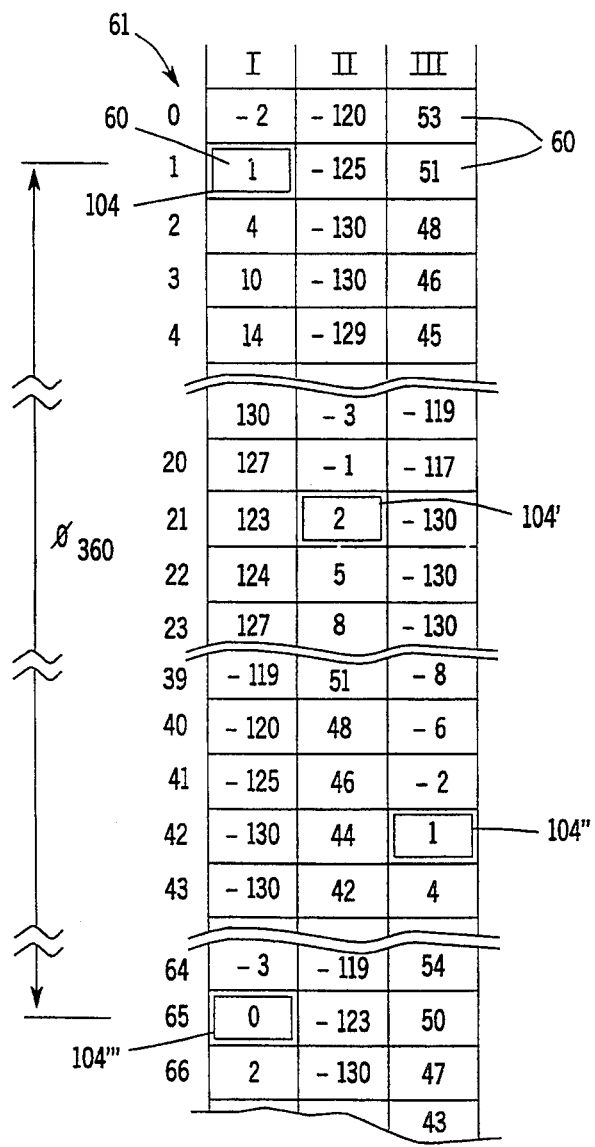
FIG. 7 is a representation of a table of samples stored in the memory of FIG. 4 showing points of zero-crossing for each of the three electrical signals of FIG. 6.

Referring now to FIGS. 6 and 7, for both of the three-phase sources 32 or 10 samples 60 are taken, of each of the electrical signals 66 associated with the three-phases, at sample intervals 62 regularly spaced in time by $\Delta t$. The samples 60 are the amplitudes of the electrical signals 66 at the time of the sample interval 62. The samples 60 are arranged in RAM 54 such that each sample may be identified by a sample number corresponding to the sample interval 62 and being a sequential integer beginning with zero and proceeding to N the last sample interval. Each sample 60 is also identified by its electrical signal 66 and hence the circuit from which the sample 60 was obtained. This identification may be most simply accomplished by arranging the samples at addresses in RAM 54 that relate to the sample number 61 and electrical signals 66. However, it will be recognized that the sample number and electrical signals may be stored as specific data linked to the data of the samples 60 without regard to the absolute address of the samples 60. For the purpose of discussion it will be assumed that the samples 60 are arranged in a data array in RAM 54 having "columns" by sample number 61 and rows by electrical signal 66.

Generally, the position of the electrical signals 66 within the phase sequence of the three-phase power is not known so the signals are simply identified as I, II and III, respectively rather than $V_{AB}$, $V_{BC}$ and $V_{CA}$. Samples obtained for each of the circuits of the three-phase sources 32 and 10 in one row, which share a sample number, were acquired during a single sample interval 62 and hence at the same time.

Figure 5:
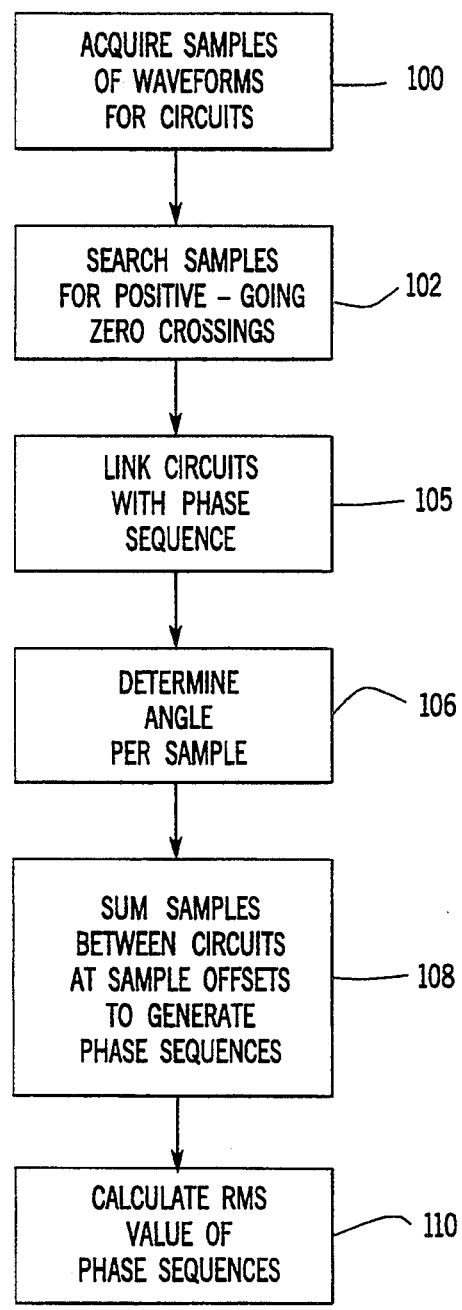
FIG. 5 is a flow chart of a program run on the microcontroller of FIG. 4 used to perform symmetrical component analysis in evaluating unbalance in three-phase systems.

Referring now to FIG. 5, in order to perform the symmetric component analysis, the microcontroller 52 reads the samples from FIFO buffer memory 50 related to either the bus 32 or the alternator 10, and to either the voltage or current of that respective device, into RAM 54 per FIG. 7. This reading of the samples from the FIFO buffer 50 to the memory of the microprocessor 52 is indicated by process block 100. Once the values for each of the samples 60 of the selected three-phase parameter and system are read into RAM 54, at process block 102 the microcontroller 52 reads through the samples 60 for each signal 66 in sequence to identify a sample number 104 at which the sampled electrical signal 66 first crosses zero in a positive going direction. This sample number 104 will be referred to as a zero-crossing. One or more such zero-crossing samples are identified for each signal I, II or III.

Because it is assumed in the present system that the circuits of the three-phase system are connected to the terminals of the monitor 20 arbitrarily with respect to their phase sequence, signals I, II and III may not be the first second and third phases of the three-phase system. The proper ordering of the signals I, II and III is therefore determined at process block 105 by locating the first zero-crossing sample 104 of circuit I and first zero-crossing samples 104' and 104" in circuits II and III after that sample 104 of circuit I.

The sample numbers of samples 104' and 104" of signals II and III are compared to the sample number of sample 104 and if the sample number of sample 104" of signal II is less than the sample number of sample 104" of signal III, then signal II is assumed to be the next phase in the phase sequence after the phase represented by signal I. In this case signal III is assumed to be third phase of that sequence. Conversely, if the sample number of sample 104" of signal III is lower than the sample number of sample 104' of signal II, then signal III is assumed to be connected to the second phase in the phase sequence after the phase of circuit I and signal II is assumed to be the third phase of that sequence. This order of the signals 66 is stored by the microcontroller 52 for use in later calculations.

At process block 106, the microcontroller 52 evaluates the frequency f of the three-phase system with respect to the sample rate $1/\Delta t$. This is done by identifying a first and second adjacent positive going zero-crossing sample number of samples 104 and 104''' of signal I. These sample numbers are compared and their difference, designated $\phi_{360}$, is the number of samples 60 per 360° of phase of the signals 66.

Division of 360° by $\phi_{360}$ yields the number of degrees per sample interval 62. This figure is multiplied by 120° to provide the number of samples per 120° of phase of the three-phase system being measured, designated the sample offset, $\phi_{120}$. This sample offset, $\phi_{120}$, is used to identify corresponding samples 60 of signals I, II, and III needed to develop positive, negative and zero phase sequence for the three-phase system. Specifically, starting with sample number 0, the positive sequence voltage ("PSV") is developed according to the following formula:

$$PSV[n] = V_{AB}[n] + V_{BC}[n+\phi_{120}] + V_{CA}[n+2\phi_{120}] \quad (8)$$

where PSV[n] is the value of the positive sequence voltage for each sample number n and where $V_{AB}[n]$ is the sample n of the voltage of the first signal of the phase sequence of the three-phases (as determined at process block 105) and $V_{BC}[n+\phi_{120}]$ and $V_{CA}[n+2\phi_{120}]$ are samples displaced by $\phi_{120}$ and two times $\phi_{120}$ for the second and third signals of the three-phases.

Likewise, as indicated by process block 108, the negative sequence voltage and current ("NSV, NSI") and zero sequence voltage and current ("ZSV, ZSI") may be obtained by the following formulas:

$$NSV[n] = V_{AB}[n] + V_{BC}[n+2\phi] + V_{CA}[n+\phi] \quad (9)$$

$$ZSV[n] = V_{AB}[n] + V_{BC}[n] + V_{CA}[n] \quad (10)$$

$$PSI[n] = I_A[n] + I_B[n+\phi] + I_C[n+2\phi] \quad (11)$$

$$NSI[n] = I_A[n] + I_B[n+2\phi] + I_C[n+\phi] \quad (12)$$

$$ZSI[n] = I_A[n] + I_B[n] + I_C[n] \quad (13)$$

Each of these computed values is stored in a separate array in RAM 54.

At process block 110, the root mean square (RMS) value of the positive, negative and zero sequence values described above and stored in RAM 54 are computed as follows:

$$RMS(S) = \sqrt{\frac{1}{3}\Delta t(S^2[0] + 4(S^2[1]) + 2(S^2[2]) + \cdots + 2(S^2[N-2]) + 4(S^2[N-1]) + S^2[N])} \quad (14)$$

where S denotes the particular sequence for which the RMS value is being computed, e.g. corresponding to one of the sequences of equations (8)–(13) above, S[n] is the nth value of the respective sequence, $S^2[n]$ is the squared value of S[n], and N represents the highest sample index, i.e. one less than the number of samples in the sequence. Formula (14) implements the RMS calculation using Simpson's Rule which provides a more accurate characterization of the area under the curve of the squared values.

Thus, RMS values may be determined for each symmetric sequence. The resulting RMS values are communicated to the programmable controller 19 through the connector 24 on the module 22 and may be stored or displayed through peripherals to the programmable controller 19 such as are generally understood in the art to provide a record and indication of the state of the three-phase power from bus 32 and alternator 10.

Many modifications and variations of the preferred embodiment which will still be within the spirit and scope of the invention will be apparent to those of ordinary skill in the art. For example, it will be apparent that additional samples may be obtained for improved accuracy. Further any fiducial point in the waveforms may be used, not just a positive going zero-crossing. Also, it will be understood that at a given sampling rate that interpolation between samples may be used to improve the accuracy of the measurement. In order to apprise the public of the various embodiments that may fall within the scope of the invention, the following claims are made.

I claim:

1. An instrument for analyzing unbalance in three-phase power as reflected in three electrical signals having corresponding phases and amplitudes and together having a phase sequence, comprising:
   a data acquisition means sampling the electrical signals for producing digitized electrical signal samples at a plurality of times;
   an electronic memory communicating with the data acquisition means for storing the digitized electrical signal samples according to a sample number which both identifies the electrical signal corresponding to the sample and identifies a time sequence in said plurality of times at which the sample was taken; and
   sequence signal computation means for deriving at least one set of sequence signal samples which represent at least one sequence signal corresponding thereto, wherein each said sequence signal sample is computed as a summation of one electrical signal sample corresponding to each of the three electrical signals, in which each electrical signal sample used in said summation is read from said electronic memory according to sample numbers indicative of substantially 120° difference in phase in said time sequence mutually between each of the three electrical signal samples used.

2. The instrument of claim 1 wherein the relative phase of the electrical signal samples used in said summation are such that the resulting set of sequence signal samples represents a positive sequence signal with respect to the three electrical signals.

3. The instrument of claim 2 including in addition an RMS calculation means for receiving the positive sequence signal and producing a positive sequence number that is an RMS value computed over the set of sequence signal samples of the positive sequence signal.

4. The instrument of claim 1 wherein the relative phase of the electrical signal samples used in said summation are such that the resulting set of sequence signal samples represents a negative sequence signal with respect to the three electrical signals.

5. The instrument of claim 4 including in addition an RMS calculator for receiving the negative sequence signal and producing a negative sequence number that is an RMS value computed over the set of sequence signal samples of the negative sequence signal.

6. The instrument of claim 1 wherein the data acquisition means produces digitized electrical signal samples that are values of current flow in conductors of the three-phase system.

7. The instrument of claim 1 wherein the data acquisition means produces digitized electrical signal samples that are values of voltage across conductors of the three-phase system.

8. The instrument of claim 1 wherein the sequence signal computation means includes:
   a zero-crossing detector for locating a first and second sample number of electrical signal samples in the electronic memory at which values of the electrical signal samples for a particular electrical signal consecutively change polarity in the same direction, the first and second sample number thereby representing samples separated by 360° of phase of the electrical signal; and a ratio engine for evaluating the time separating the first and second sample numbers and establishing a corresponding time between samples separated by 120° of phase of the electrical signal;

wherein the sequence signal computation means employs that corresponding time to determine said sample numbers indicative of substantially 120° difference in phase in said time sequence.

9. The instrument of claim 1 wherein the sequence signal computation means includes:

a zero-crossing detector for locating first, second, and third sample numbers corresponding to polarity changes in the same direction for each of the first, second and third of the electrical signals, respectively; and a phase rotation sequence identifier means for identifying the order of phase rotation for the three electrical signals based upon said first, second and third sample numbers, wherein the sequence signal computation means is thereby able to identify whether the sequence signal produced represents a positive sequence signal or a negative sequence signal.

10. A method of analyzing unbalance in a three-phase system having three electrical signals with corresponding phases and amplitudes and a phase rotation sequence comprising the steps of:

acquiring digitized electrical signal samples corresponding to the amplitudes of the electrical signals at a plurality of times;

storing the electrical signal samples at memory addresses according to a sample number which both identifies the electrical signal corresponding to the sample and identifies a time sequence in said plurality of times at which the sample was taken; and deriving at least one set of sequence signal samples which represent at least one sequence signal corresponding thereto, wherein each said sequence signal sample is computed as a summation of one electrical signal sample corresponding to each of the three electrical signals, in which each electrical signal sample used in said summation is read from said memory address according to sample numbers indicative of substantially 120° difference in phaser in said time sequence mutually between each of the three electrical signal samples used.

11. A method of analyzing unbalance in a three-phase system having three electrical signals with corresponding phases and amplitudes and a phase rotation sequence comprising the steps of:

(a) acquiring digitized electrical signal samples corresponding to the amplitudes of the electrical signals at a plurality of times;

(b) storing the electrical signal samples at memory addresses in an electronic memory according to a sample number which both identifies the electrical signal corresponding to the sample and identifies a time sequence in said plurality of times at which the sample was taken;

(c) reading the electronic memory to locate first, second, and third sample numbers corresponding to polarity changes in the same direction;

(d) identifying the order of phase rotation for the three electrical signals based upon said first, second and third sample numbers;

e) reading the electronic memory to obtain a first through fifth value of samples for each of the electrical signals, the first value being a value corresponding to the first electrical signal, the second and third values corresponding to the electrical signal which follows the first electrical signal in phase rotation as determined in step (d) and representing a lag in phase with respect to the first value by 120° and 240° respectively, the fourth and fifth values corresponding to the electrical signal which precedes the first electrical signal in phase rotation as determined in step (d) and representing a lag in phase with respect to the first value by 240° and 120° respectively;

(f) repeatedly summing the first, second and fourth values of the samples obtained in step (e) for a plurality of successive different values for the first value to produce a respective plurality of sequence signal samples which together form a positive sequence signal portion of a set of symmetrical sequence signals for analyzing the unbalance of the three-phase system; and (g) repeatedly summing the first, third and fifth values of the samples obtained in step (e) for a plurality of successive different values for the first value to produce a respective plurality of sequence signal samples which together form a negative sequence signal portion of said set of symmetrical sequence signals for analyzing the unbalance of the three-phase system.

* * * * *